(12) United States Patent
Nakagami et al.

(10) Patent No.: US 7,954,337 B2
(45) Date of Patent: Jun. 7, 2011

(54) INTEGRATED ELECTRIC COMPRESSOR

(75) Inventors: Takashi Nakagami, Aichi-ken (JP);
Koji Nakano, Aichi-ken (JP); Masahiko Asai, Aichi-ken (JP); Makoto Hattori, Aichi-ken (JP); Kazuki Niwa, Aichi-ken (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 434 days.

(21) Appl. No.: 12/300,403

(22) PCT Filed: Sep. 8, 2008

(86) PCT No.: PCT/JP2008/066170
§ 371 (c)(1),
(2), (4) Date: Nov. 11, 2008

(87) PCT Pub. No.: WO2009/107264
PCT Pub. Date: Sep. 3, 2009

(65) Prior Publication Data
US 2010/0170294 A1    Jul. 8, 2010

(30) Foreign Application Priority Data
Feb. 28, 2008   (JP) ................... 2008-048488

(51) Int. Cl.
*F25B 39/04* (2006.01)
(52) U.S. Cl. ........................................................ 62/508
(58) Field of Classification Search .............. 62/505, 62/508; 417/411
See application file for complete search history.

(56) References Cited

U.S. PATENT DOCUMENTS

| | | | |
|---|---|---|---|
| 7,273,357 B2 * | 9/2007 | Hattori et al. | ........ 417/313 |
| 2006/0044848 A1 | 3/2006 | Suzuki et al. | |
| 2007/0008679 A1 | 1/2007 | Takahasi et al. | |

FOREIGN PATENT DOCUMENTS

| | | |
|---|---|---|
| EP | 1 594 164 A1 | 9/2005 |
| JP | 2004-134460 A | 4/2004 |
| JP | 2004-190547 A | 7/2004 |
| JP | 2004-265931 A | 9/2004 |
| JP | 2006-067754 A | 3/2006 |
| JP | 3760887 B2 | 3/2006 |
| JP | 2007-259690 A | 10/2007 |
| JP | 2007-282309 A | 10/2007 |
| JP | 2007-295639 A | 11/2007 |
| JP | 2007-315269 A | 12/2007 |
| WO | WO 2004/073065 A1 | 8/2004 |

OTHER PUBLICATIONS

International Search Report dated Dec. 16, 2008 issued in corresponding application PCT/JP2008/066170.

* cited by examiner

*Primary Examiner* — Melvin Jones
(74) *Attorney, Agent, or Firm* — Westerman, Hattori, Daniels & Adrian, LLP

(57) ABSTRACT

The object is to provide an integrated compressor that enables a control board to be miniaturized while ensuring a layout in which the heat radiation of parts is considered. Diodes 43 and IGBTs 42 that correspond to each of the U-phase, V-phase and W-phase are arrayed in series for each phase. Rectangular chips are used for the diodes 43 and IGBTs 42. As a result of this, a power board 16 is substantially miniaturized, and the diode 43, the IGBT 42, a P-terminal electrode pattern 40, an N-terminal electrode pattern 41, a shunt resistor 44, output terminal patterns 48U, 48V, 48W, and a feed pattern 50 are disposed so as to lie in a region in contact with an outer surface of a housing.

7 Claims, 7 Drawing Sheets

INTEGRATED ELECTRIC COMPRESSOR

TECHNICAL FIELD

The present invention relates to an integrated electric compressor that constitutes a vehicle-mounted air conditioner.

BACKGROUND ART

A vehicle-mounted air conditioner is required to meet space savings because various pieces of equipment are housed in the engine room of a vehicle. For this reason, in recent years there have been provided integrated electric compressors in which a compressor that constitutes a vehicle-mounted air conditioner, a motor for driving the compressor and a driving board for driving the motor are housed integrally in a housing.

In such an integrated electric compressor, switching elements composed of a plurality of IGBTs (insulated gate bipolar transistors) are provided on a board for controlling the operation of a motor in order to supply a three-phase alternating current to the motor. A high voltage, such as 300 V, is supplied to these switching elements from an external high-voltage power source (not shown) (refer to Patent Document 1, for example).

Patent Document 1: Japanese Patent No. 3760887

Package parts of commercial IGBTs have hitherto been used in such switching elements. Package parts of IGBTs are units and in each unit one IGBT and one diode that constitute one switching element are modularized.

Such units generate a three-phase current to operate a motor. For this reason, the units are provided with the IGBTs and the diodes in quantities of three sets corresponding to the U-phase, V-phase and W-phase.

Incidentally, miniaturization is constantly required of each automotive accessory. This applies also to the electric compressor, and in studying the miniaturization of the electric compressor, the miniaturization of a control board for driving the motor becomes essential.

However, when package parts are used in the switching elements as previously, the package parts have sizes that are large to a certain degree. For this reason, if the switching elements are provided in quantities of three sets as described above, the size of a board on which the switching elements are mounted increases. Then, the board may sometimes protrude sideways from the electric compressor. Therefore, it may be possible to prevent the board from protruding sideways from the electric compressor by dividing the board into a plurality of layers. In this concept, however, the thickness of the control board increases virtually and, therefore, it cannot be said that this is an adequate solution from the standpoint of miniaturization.

In addition, the control board includes parts that generate heat, such as IGBTs. Because of the heat radiation from these parts, these parts are preferably disposed along the portion of the housing in which the refrigerant flows so that these parts are cooled by a refrigerant flowing in the housing of the electric compressor. However, because the arrangement of the parts is limited by this, it is difficult to miniaturize the control board also in this respect.

The present invention has been made on the basis of such a technical challenge, and has as its object the provision of an integrated electric compressor that enables a control board to be miniaturized while ensuring a layout in which the heat radiation of parts is considered.

DISCLOSURE OF THE INVENTION

The integrated electric compressor of the present invention accomplished on the basis of this object comprises a compressor that constitutes an air conditioner, a motor for driving the compressor, a control board that controls the operation of the motor, and a housing that houses the compressor, the motor and the control board. The control board comprises a switching element that is mounted on a first board and controls the application timing of a voltage from a power source to the motor in order to rotatably drive the motor by a three-phase alternating current and a control circuit that is mounted on a second board disposed so as to be opposed to the first board in a manner of being spaced therefrom and controls the operation of the switching element. An IGBT and a diode that constitute the switching element are bare chip assembled.

Bare-chip assembling of the IGBT and the diode on the first board enables the first board to be miniaturized.

The switching elements are preferably arrayed in quantities of three sets corresponding to each of the U-phase, V-phase and W-phase in a direction orthogonal to an axial direction of the motor in order to generate a three-phase alternating current that drives the motor, and in each of the sets, the IGBT and the diode are preferably arrayed along the axial direction of the motor.

The IGBT and the diode are disposed in a region along a surface of the housing that is cooled by a refrigerant flowing in the housing. The region where the IGBT and the diode are provided can be made small by the bare-chip assembly of the IGBT and the diode and this enables the IGBT and the diode to be disposed in the region along the surface of the housing that is cooled by the flow of a refrigerant in the housing.

When a snubber circuit composed of a resistor and a capacitor is provided on the first board between the power source and the switching element in order to reduce radio noise, the resistor and the capacitor are preferably disposed outside the region along the surface of the housing that is cooled by the flow of a refrigerant in the housing. The heat generation of the resistor and the capacitor is small and, therefore, it is unnecessary to consider cooling (heat radiation) by the refrigerant flowing in the housing for such parts of small heat generation.

The housing can be divided into a motor-housing section that houses the motor and a compressor-housing section that houses the compressor. In this case, on the first board, terminals of the U-phase, V-phase and W-phase for supplying a three-phase alternating current generated in the switching element to the motor are preferably disposed on a mating face side of the motor-housing section with the compressor-housing section. If the terminals of the U-phase, V-phase and W-phase are disposed on the mating face side of the motor-housing section with the compressor-housing section, when stators of the U-phase, V-phase and W-phase of the motor and the terminals of the U-phase, V-phase and W-phase of the first board are connected together via lead wires during assembly, the worker can perform the connection work by inserting his or her fingers into an opening of the motor-housing section on the compressor-housing section side.

On the first board, a voltage application wiring pattern for supplying a voltage to the switching element and an output wiring pattern for supplying a voltage from the switching element to the motor are disposed so as to oppose to a signal line pattern for supplying a control signal for driving the switching element, with the IGBT and the diode that constitute the switching element interposed.

The voltage application wiring pattern and the output wiring pattern are high-voltage systems in which a high voltage, such as 300 V, flows, and the signal line pattern is a low-voltage system in which a low voltage, such as 5 V, flows. The high-voltage systems and the low-voltage system are disposed so as to be opposed to each other, with the switching element interposed, whereby it is possible to prevent electromagnetic noise caused by the high-voltage systems from having an affect on a signal of the low-voltage system.

When a temperature sensor for detecting operating temperatures of the IGBT is provided, the temperature sensor is preferably disposed in a region where the IGBT and the diode are arrayed.

According to the present invention, the miniaturization of the first board can be accomplished by performing the barechip assembly of the IGBT and the diode on the first board. This enables the region where the IGBT and the diode are provided to be made small and it becomes possible to dispose the IGBT and the diode in the region along the surface of the housing that is cooled by the flow of the refrigerant in the housing. As a result, it becomes possible to miniaturize the control board while ensuring a layout in which the heat radiation of parts is considered.

DESCRIPTION OF SYMBOLS

10 . . . Electric compressor (integrated electric compressor), 11 . . . Housing, 12 . . . Inverter unit, 13 . . . Capacitor, 14 . . . Inductor, 15 . . . Control circuit board (second board), 16 . . . Power board (first board), 16a . . . Side, 16b . . . Narrow side, 16c . . . Side, 18 . . . Switching element group, 20 . . . Motor, 21 . . . Compressor, 30 . . . P-terminal, 31 . . . N-terminal, 32 . . . U-terminal, 33 . . . V-terminal, 34 . . . W-terminal, 40 . . . P-terminal electrode pattern, 41 . . . N-terminal electrode pattern, 42 . . . IGBT, 43 . . . Diode, 44 . . . Shunt resistor, 45 . . . Temperature sensor, 46 . . . Capacitor, 47 . . . Resistor, 48U, 48V, 48W . . . Output terminal pattern (output wiring pattern), 50 . . . Feed pattern (voltage application wiring pattern), 52 . . . IGBT gate signal line (signal line pattern), 53 . . . Ground pattern, 60 . . . Motor case (motor-housing section), 61 . . . Compressor case (compressor-housing section)

BEST MODE FOR CARRYING OUT THE INVENTION

The present invention will be described below in detail on the basis of an embodiment shown in the accompanying drawings.

Figure 1:
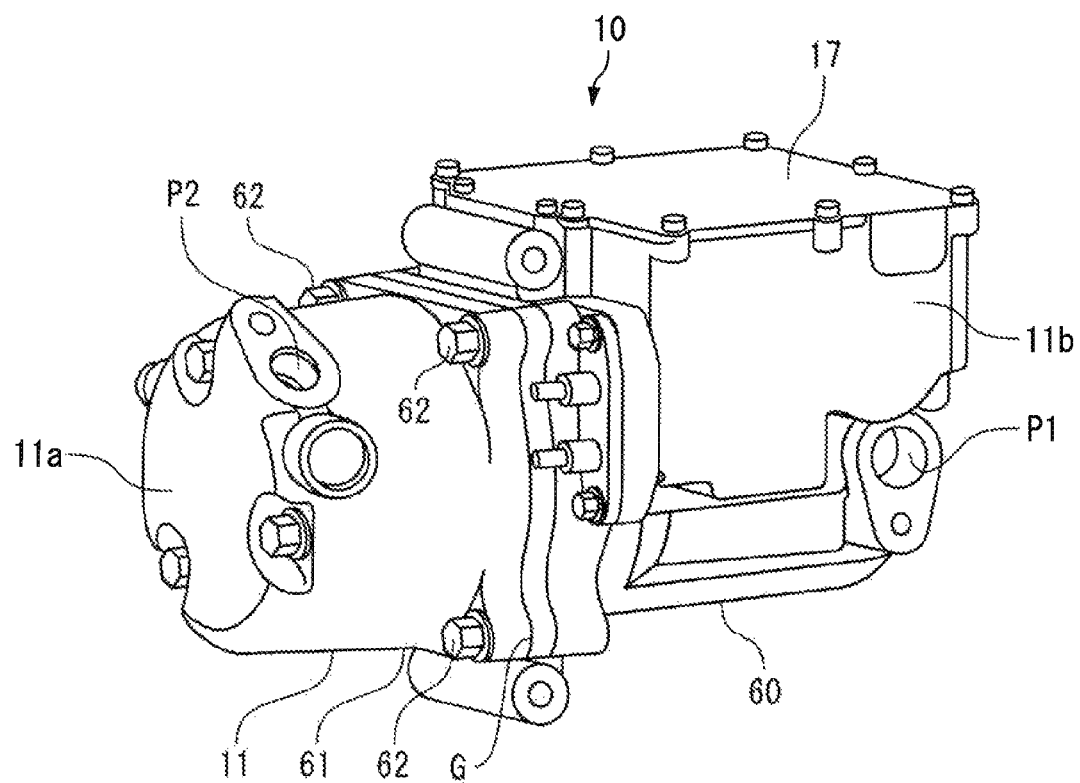
FIG. 1 is a perspective view showing the appearance of an integrated electric compressor in this embodiment.
Figure 2:
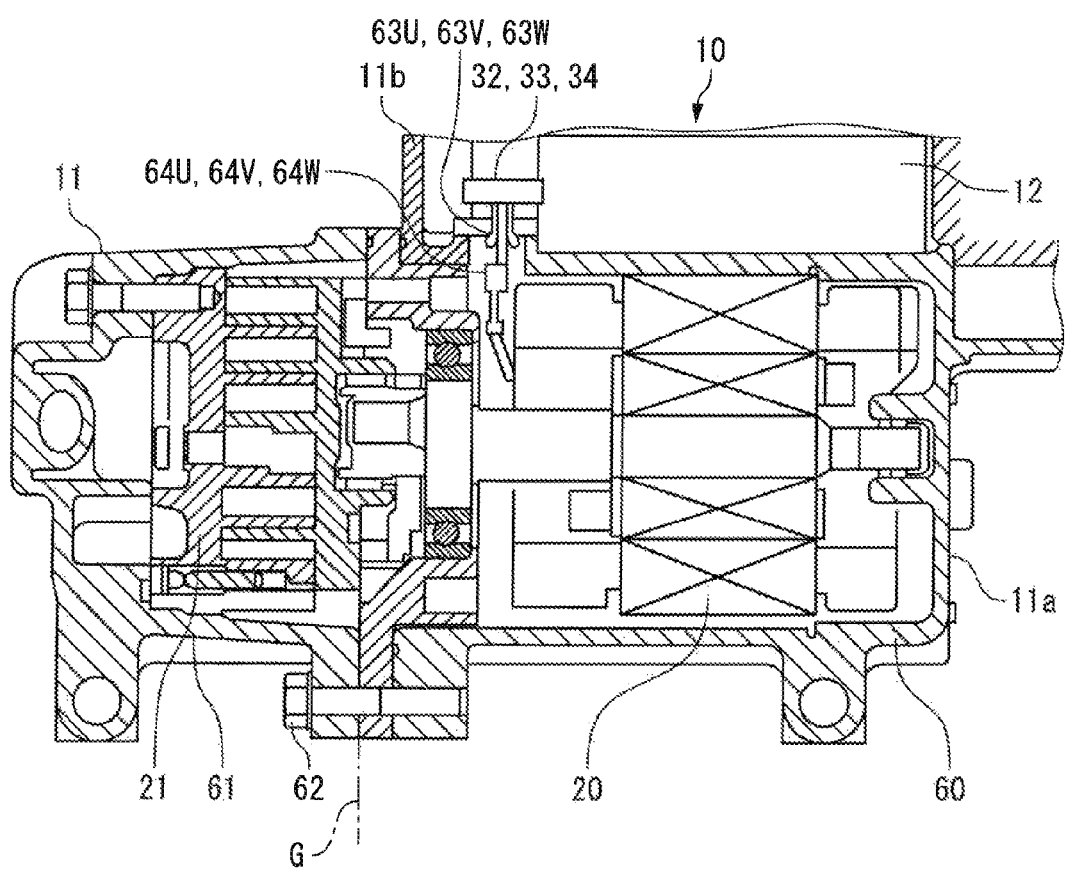
FIG. 2 is a cross-sectional view taken along the axial direction of a motor of the integrated electric compressor.

FIGS. 1 and 2 are diagrams to show the construction of an electric compressor (an integrated electric compressor) 10 in this embodiment.

As shown in FIGS. 1 and 2, the electric compressor 10 is such that a motor 20 and a scroll-type compressor 21 are housed in a lower housing chamber 11a of a housing 11. An inverter unit 12 is housed in an upper housing chamber 11b of the housing 11 that opens upward. An upward opening of the upper housing chamber 11b is covered with a cover 17.

As shown in FIG. 1, a refrigerant is introduced into the housing 11 from a refrigerant introduction port P1, which is formed in an end portion of the lower housing chamber 11a on the side where the motor 20 is provided, and the refrigerant compressed by the compressor 21 is discharged from a refrigerant discharge port P2, which is formed in an end portion on the side where the compressor 21 is provided. The housing 11 is cooled by this refrigerant.

Figure 3A:
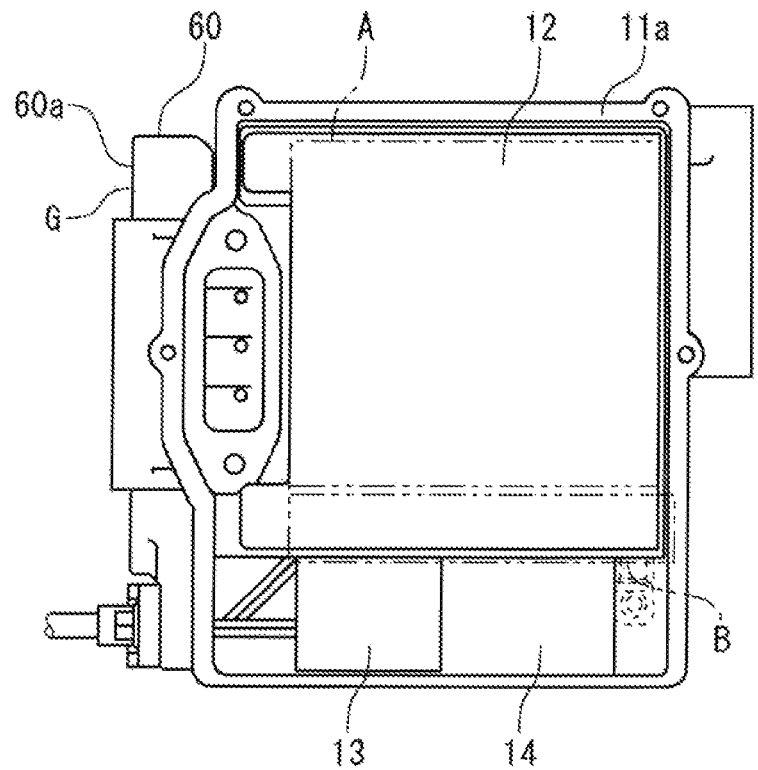
FIG. 3A is a plan view of a motor case and FIG. 3B is a cross-sectional side view of a motor case.
Figure 3B:
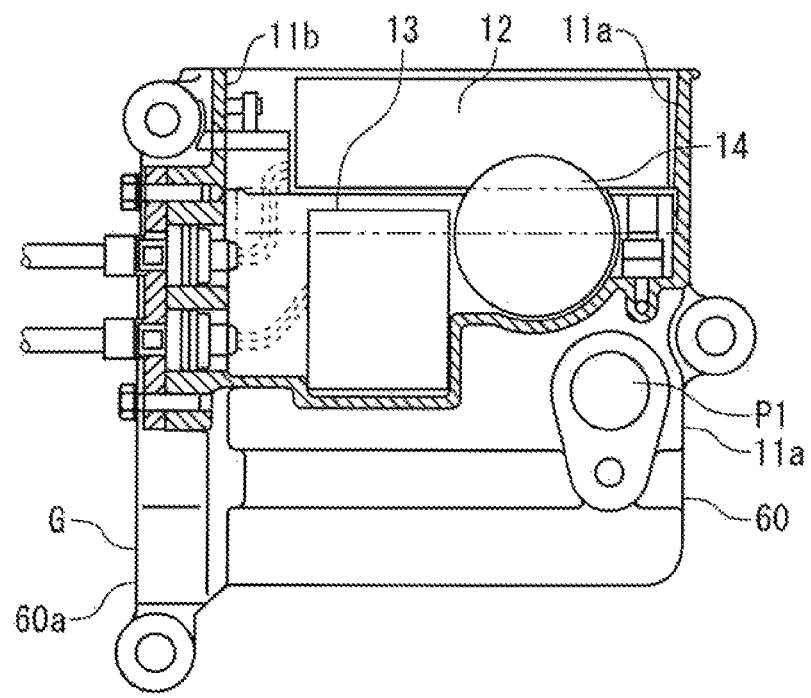
Figure 4:
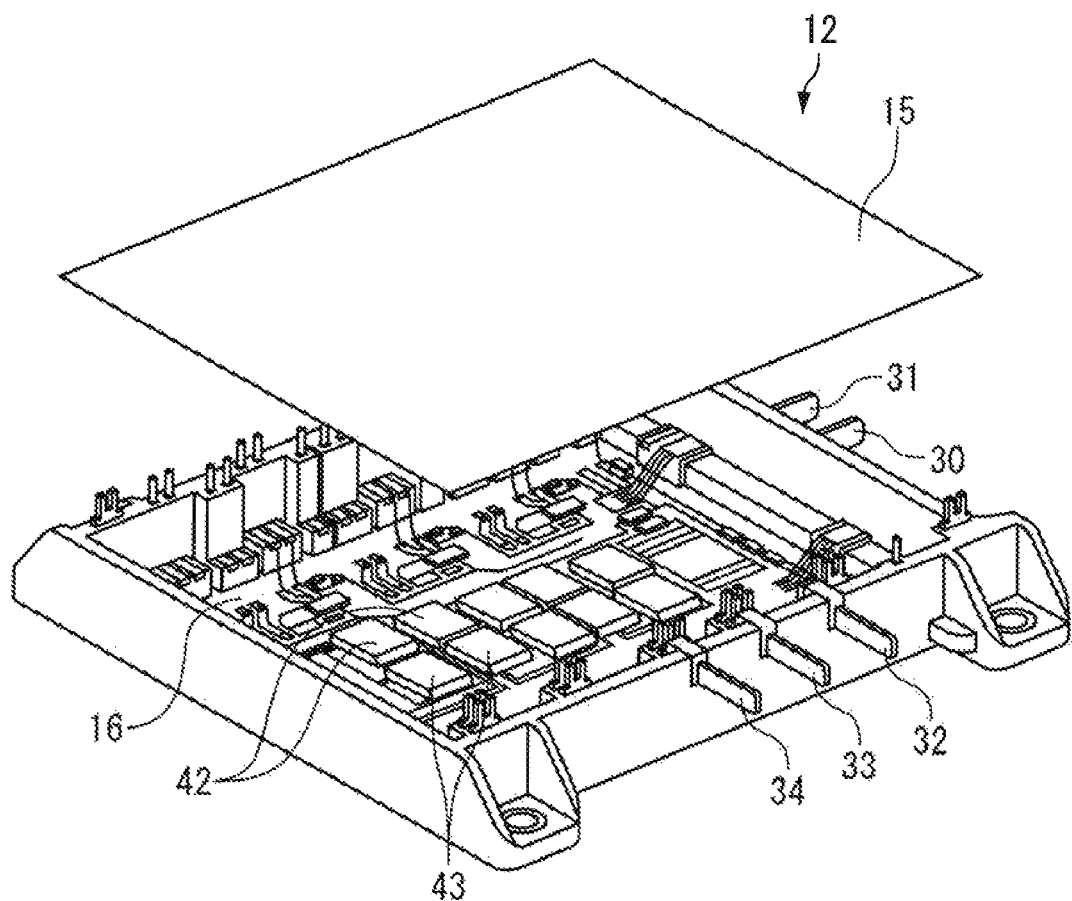
FIG. 4 is a perspective view of an inverter unit.

As shown in FIG. 3A, FIG. 3B and FIG. 4, the inverter unit 12 is composed of a capacitor 13 and an inductor 14 for smoothing a direct-current voltage inputted to the inverter unit 12, a control circuit board (a second board) 15 for controlling the application of a high-voltage alternating current to the motor 20, and a power board (a first board) 16 that converts a direct current supplied from a high-voltage power source to an alternating current and applies the alternating current to the motor 20, thereby rotatably driving the motor 20.

The upper housing chamber 11b has a width that is larger than the diameter of the lower housing chamber 11a. As a result of this, the upper housing chamber 11b is formed so as to protrude sideways from the lower housing chamber 11a. As a result of this, as shown in FIGS. 3A and 3B, the upper housing chamber 11b is such that a region A corresponding to a portion of the housing 11 where the motor 20 is housed, is cooled by a refrigerant passing in the housing 11, and in a region that protrudes sideways from the region A, the cooling effect by the refrigerant is small.

The capacitor 13 and the inductor 14, which belong to the inverter unit 12 housed in the upper housing chamber 11b, are disposed in positions protruding sideways from the region A.

On the control circuit board 15, there are mounted a transformer that converts a prescribed voltage (for example, 12 V) supplied from a battery of the vehicle to a low voltage for control (for example, 5 V), a communication circuit for performing communication with a host CPU of the vehicle, a CPU that governs the control of the operation of the electric compressor 10, and the like.

As shown in FIG. 4, the power board 16 receives a high voltage, such as 300 V, from an external high-voltage power source (not shown) by use of a P-terminal 30 and an N-terminal 31. The power board 16 supplies a three-phase alternating current to the outside by use of a U-terminal 32, a V-terminal 33 and a W-terminal 34, and rotatably drives the motor 20.

Figure 5:
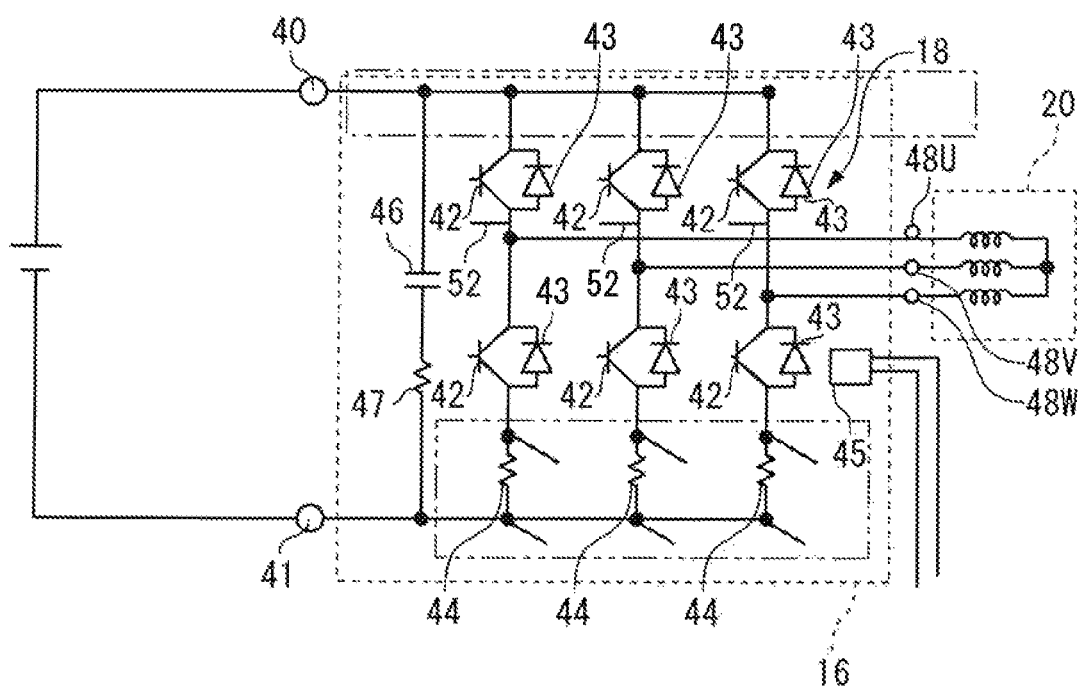
FIG. 5 is a diagram showing the circuit configuration of a power board.

FIG. 5 shows a circuit configuration of the power board 16. As shown in FIG. 5, the power board 16 is provided with a P-terminal electrode pattern 40 and an N-type electrode pattern 41, in which the P-terminal 30 and the N-terminal 31 are respectively provided, a switching element group 18 composed of a plurality of sets of IGBTs 42 and diodes 43, shunt resistors 44 for detecting a current flowing in each of the U-phase, V-phase and W-phase, a temperature sensor 45 for detecting temperatures of the IGBTs 42 in operation, a capacitor 46 and a resistor 47 that constitute the snubber circuit, and output terminal patterns (output wiring patterns) 48U, 48V, 48W, in which the U-terminal 32, the V-terminal 33 and the W-terminal 34 are respectively provided.

The snubber circuit composed of the capacitor 46 and the resistor 47 is provided between the P-terminal electrode pattern 40 and the N-type electrode pattern 41 and the switching element group 18. The snubber circuit, which is originally intended for protecting the IGBTs 42 and the diodes 43 from overvoltages, causes surge currents, which are generated by increased frequencies of a driving signal inputted from the control circuit board 15 to the switching element group 18 when the power source is off, to be consumed.

In this manner, surge currents are caused to be consumed in the snubber circuit, with the result that high-frequency components are prevented from being superposed on a driving signal inputted from the control circuit board 15 to the switching element group 18. As a result, leak currents generated between the motor 20 and the housing 11 can be suppressed and radio noise can be reduced.

In the control circuit board 15, an unillustrated gate circuit is controlled by the control executed by the CPU of the control circuit board 15 and a driving signal of the control circuit board 15 is transmitted from the control circuit board 15 to an IGBT gate signal line (signal line pattern) 52 of the power board 16 and is inputted to the switching element group 18. The supply timing of a high voltage supplied from the high-voltage power source via the P-terminal electrode pattern 40 and the N-terminal electrode pattern 41 is controlled by the operation of the switching element group 18. As a result of this, a three-phase alternating current is applied to the motor 20 from the output terminal patterns 48U, 48V, 48W via the U-terminal 32, the V-terminal 33 and the W-terminal 34, and rotatably drives the motor 20.

Figure 6A:
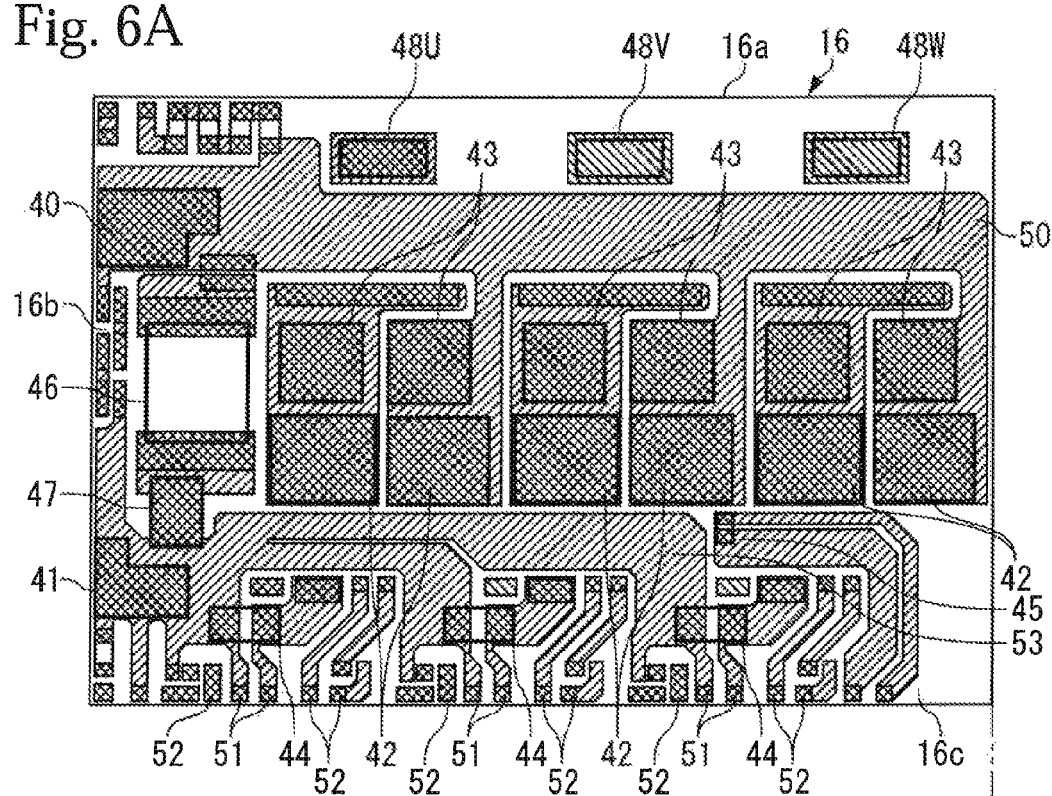
FIG. 6A is a diagram showing an example of the packaging layout of a power board and FIG. 6B is a diagram showing a modification of the packaging layout shown in FIG. 6A.
Figure 6B:
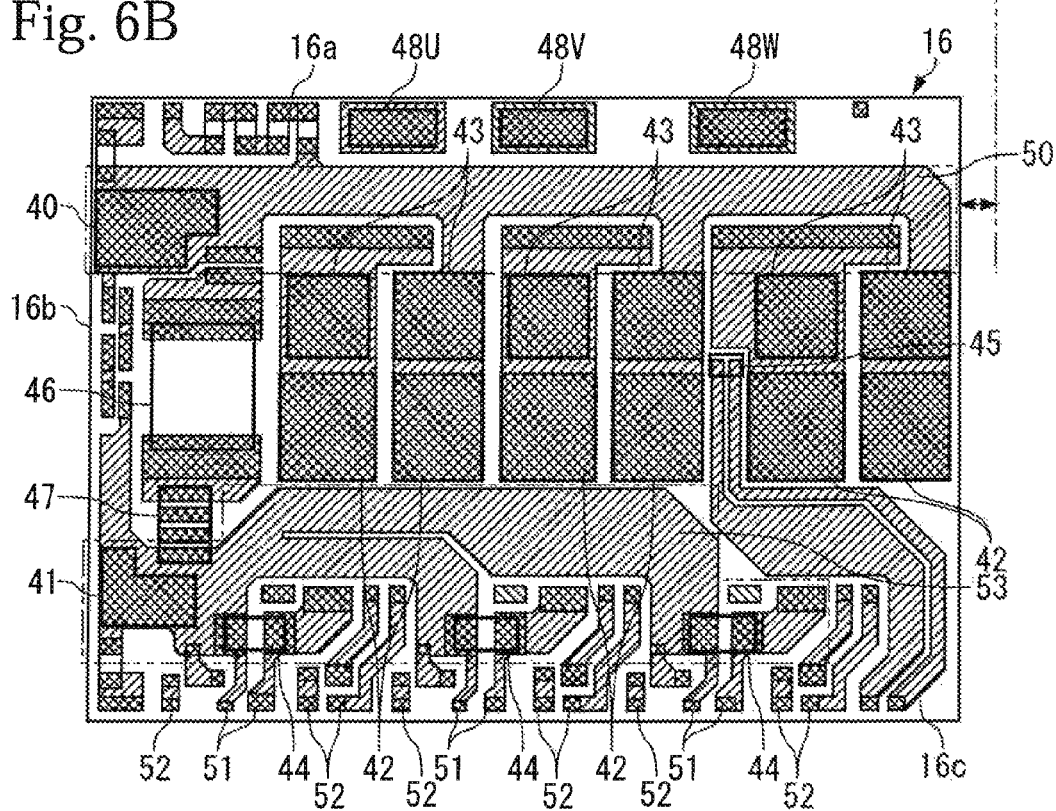

FIGS. 6A and 6B are diagrams showing examples of the packaging layout of the P-terminal electrode pattern 40, the N-terminal electrode pattern 41, the IGBTs 42, the diodes 43, the shunt resistor 44, the IGBT gate signal line 52, the temperature sensor 45, the capacitor 46 and the resistor 47 on the power board 16.

As shown in FIG. 6A, the power board 16 has a rectangular shape as a whole, and the output terminal patterns 48U, 48V, 48W are disposed along one side 16*a*.

Three sets of diodes 43 and IGBTs 42 corresponding to each of the U-phase, V-phase and W-phase are arrayed in series from the output terminal patterns 48U, 48V, 48W along a direction orthogonal to the side 16*a*. In each of the phases, the diodes 43 and the IGBTs 42 are provided in parallel each in quantities of two. The diodes 43 and the IGBTs 42 are each rectangular chips and mounted on the power board 16 via a metal heat-radiating plate (not shown). In the example of a layout shown in FIG. 6A, the IGBTs 42 are rectangular and are provided so that the narrow-side direction thereof is aligned with the array direction of the diodes 43 and IGBTs 42.

A total of six diodes 43 are arrayed parallel to the output terminal patterns 48U, 48V, 48W. Between the diodes 43 and the output terminal patterns 48U, 48V, 48W, there is formed a feed pattern (voltage application wiring pattern) 50 for feeding power to the output terminal patterns 48U, 48V, 48W. In this feeding pattern 50, a P-terminal electrode pattern 40 is formed in a position along a narrow side 16*b* orthogonal to the side 16*a* of the power board 16.

In the power board 16, takeout wires 51 of the shunt resistors 44 and IGBT gate signal lines 52 for sending a gate signal for driving the IGBTs 42 are arrayed along a side 16*c* parallel to the side 16*a* for each of the U-phase, V-phase and W-phase. These takeout wires 51 and IGBT gate signal lines 52 are connected to the control circuit board 15, which is disposed parallel to and above the power board 16, via unillustrated connectors.

Between these takeout wires 51 and IGBT gate signal lines 52 and the above-described six IGBTs 42, there is formed a ground pattern 53, and in this ground pattern 53, an N-terminal electrode pattern 41 is formed in a position along the narrow side 16*b* of the power board 16.

Shunt resistors 44 corresponding to each of the U-phase, V-phase and W-phase are disposed in gaps of the ground pattern 53.

On the side facing the IGBTs 42 of the ground pattern 53, a temperature sensor 45 is provided in the vicinity of the IGBTs 42.

The capacitor 46 and the resistor 47 that constitute the snubber circuit are disposed in positions along the narrow side 16*b* of the power board 16 so as to be interposed between the P-terminal electrode pattern 40 and the N-terminal electrode pattern 41.

FIG. 6B shows a modification of the packaging layout shown in FIG. 6A.

In the example of a layout of the power board 16 shown in FIG. 6B, the basic layout is common to the example of a layout shown in FIG. 6A. The difference lies first in that the rectangular IGBTs 42 are provided so that the wide-side direction thereof is aligned with the array direction of the diodes 43 and IGBTs 42.

As a result of this, compared to the example of a layout shown in FIG. 6A, it is possible to reduce the width of the power board 16 in a direction orthogonal to the direction in which the diodes 43 and IGBTs 42 are arrayed in series, i.e., in a direction in which the diodes 43 and IGBTs 42 of each phase are arrayed in parallel.

Also, the example of FIG. 6B differs from the example of FIG. 6A in that the temperature sensor 45 is disposed in the group of a plurality of arrayed diodes 43 and IGBTs 42. By thus disposing the temperature sensor 45 in the group of a plurality of arrayed diodes 43 and IGBTs 42, which generate heat greatly, it becomes possible to detect the temperature of the IGBTs 42, which are the objects of temperature detection, with better accuracy than in the example of FIG. 6A.

As shown in FIG. 2, in the lower housing chamber 11*a* of the housing 11, a motor case (motor-housing section) 60 that houses the motor 20 and a compressor case (compressor-housing section) 61 that houses the compressor 21 are integrally connected with a bolt 62, with mutual openings mating with each other at a mating face G.

Figure 7A:
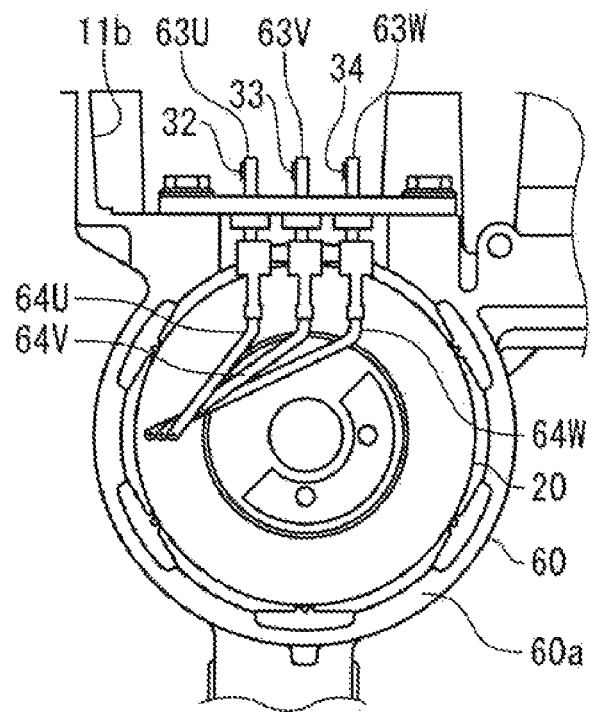
FIG. 7A is a front view of a motor case and FIG. 7B is a front view of the motor case during assembling.

As shown in FIG. 7A, the U-phase, V-phase and W-phase of the motor 20 are connected to glass terminals 63U, 63V, 63W fixed to the above-described U-terminal 32, V-terminal 33 and W-terminal 34 via lead wires 64U, 64V, 64W.

Figure 7B:
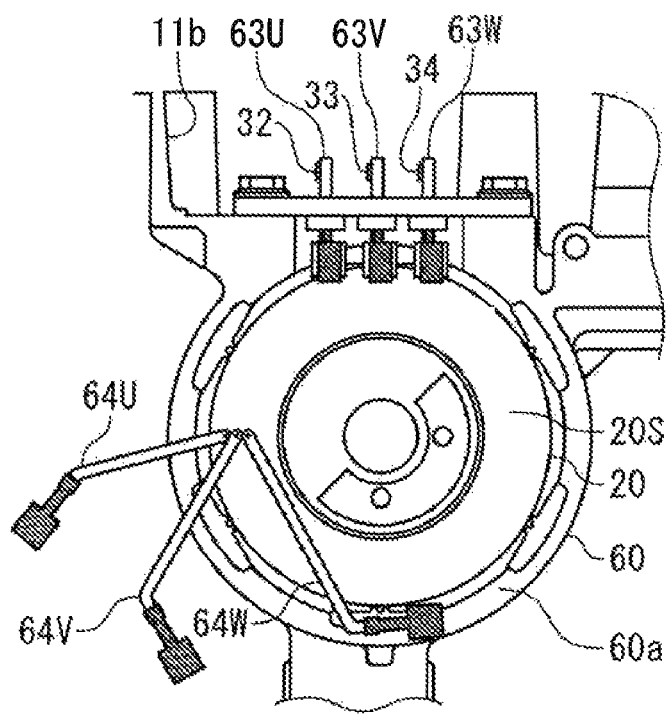

As shown in FIG. 7B, during the assembly of the electric compressor 10, the lead wires 64U, 64V, 64W are attached to a stator 20S of the motor 20. This motor 20 is housed in the motor case 60 and the inverter unit 12 is housed in the upper housing chamber 11*b* positioned on a top surface of the motor case 60. At this time, the lead wires 64U, 64V, 64W are exposed from an opening 60*a* of the motor case 60, with the compressor 61 unattached. In this state, therefore, the worker inserts his or her fingers into the opening 60*a* and, as shown in FIG. 7A, causes the terminals of the lead wires 64U, 64V, 64W to engage with the glass terminals 63U, 63V, 63W.

For the reason of the above-described assembly work, as shown in FIG. 2, the power board 16 of the inverter unit 12 is provided so that the U-terminal 32, the V-terminal 33 and the W-terminal 34 are positioned on the opening 60*a* side of the motor case 60. That is, the power board 16 is disposed so that in the power board 16, the direction connecting the side 16*a* and the side 16*c* is aligned with the axial direction of the motor 20.

In this construction, the diodes 43 and IGBTs 42 corresponding to each of the U-phase, V-phase and W-phase are arrayed in series for each phase and rectangular chips are used for the diodes 43 and IGBTs 42. As a result of this, the power board 16 can be substantially miniaturized compared to a conventional case where package parts are used for IGBTs and particularly, it is possible to reduce the width in a direction orthogonal to the direction in which the diodes 43 and IGBTs 42 are arrayed in series, i.e., in a direction in which the diodes 43 and IGBTs 42 of each phase are arrayed in parallel. As a result of this, it becomes possible to dispose the diodes 43, the IGBTs 42, the P-terminal electrode pattern 40, the N-terminal electrode pattern 41, the shunt resistor 44, the output terminal patterns 48U, 48V, 48W, and the feed pattern 50, which are heat-generating parts, so as to lie in a region corresponding to the area A of the outer surface of the housing 11, which is cooled by the passage of a refrigerant in the interior. At this time, the capacitor 46 and the resistor 47 that do not require cooling can be disposed in positions protruding sideways from the housing 11 (the region indicated by the alternate long and two short dashes lines B in FIG. 3A). In this manner, it is possible to accomplish miniaturization while ensuring the cooling function of the component parts of the inverter unit 12, thereby contributing to the miniaturization of the electric compressor 10.

The above-described advantages become more remarkable by providing the rectangular IGBTs 42 so that the wide-side direction thereof is aligned with the array direction of the diodes 43 and the IGBTs 42.

On the power board 16, the P-terminal electrode pattern 40, output terminal patterns 48U, 48V, 48W, and the feed pattern 50 in which a high voltage is applied and the N-terminal electrode pattern 41, shunt resistor 44, takeout wire 51, IGBT gate signal line 52, and ground pattern 53 in which a low voltage is applied are disposed so as to be opposed to each other, with the diodes 43 and the IGBTs 42 interposed. In this manner, the high-voltage systems and the low-voltage system are disposed in an opposed manner, with the switching element group 18 interposed, whereby it is possible to prevent electromagnetic noise caused by the high-voltage systems from having an affect on a signal of the low-voltage system.

Furthermore, as shown in FIG. 6B, the temperature sensor 45 is disposed in the group of a plurality of arrayed diodes 43 and IGBTs 42, whereby it becomes possible to detect the temperature of the IGBTs 42, which are the objects of temperature detection, with better accuracy. This arrangement of the temperature sensor 45 has been realized because the miniaturization of the power board 16 has been accomplished by the above-described layout of the diodes 43 and the IGBTs 42 on the power board 16 and because it has become possible to dispose the heat-generating parts in a region in contact with the outer surface of the housing 11.

Incidentally, in the above embodiment, the description was given of the construction of the electric compressor 10, and mainly the layout of the power board 16. For other portions, however, it is possible to appropriately adopt other constructions. Also for the power board 16, it is also possible to adopt constructions other than those described above so long as the gist of the present application, i.e., miniaturization and the cooling of parts can be achieved thereby.

Furthermore, the constructions described in the above embodiment can be appropriately selected and can be appropriately changed to other constructions without departing from the gist of the present invention.

The invention claimed is:

1. An integrated electric compressor comprising:
   a compressor that constitutes an air conditioner;
   a motor for driving the compressor;
   a control board that controls the operation of the motor; and
   a housing that houses the compressor, the motor and the control board,
   wherein the control board comprises: a switching element that is mounted on a first board and controls the application timing of a voltage from a power source to the motor in order to rotatably drive the motor by a three-phase alternating current; and a control circuit that is mounted on a second board disposed so as to be opposed to the first board in a manner of being spaced therefrom and controls the operation of the switching element, and
   wherein an IGBT (insulated gate bipolar transistor) and a diode that constitute the switching element are bare chip assembled.

2. The integrated electric compressor according to claim 1, wherein the switching elements are arrayed in quantities of three sets corresponding to each of the U-phase, V-phase and W-phase in a direction orthogonal to an axial direction of the motor in order to generate a three-phase alternating current that drives the motor, and in each of the sets, the IGBT and the diode are arrayed along the axial direction of the motor.

3. The integrated electric compressor according to claim 1, wherein the IGBT and the diode are disposed in a region along a surface of the housing that is cooled by a refrigerant flowing in the housing.

4. The integrated electric compressor according to claim 3, wherein on the first board between the power source and the switching element, there is provided a snubber circuit composed of a resistor and a capacitor in order to reduce radio noise, and the resistor and the capacitor are disposed outside the region along the surface of the housing that is cooled by the flow of a refrigerant in the housing.

5. The integrated electric compressor according to claim 1, wherein the housing can be divided into a motor-housing section that houses the motor and a compressor-housing section that houses the compressor, and on the first board, terminals of the U-phase, V-phase and W-phase for supplying a three-phase alternating current generated in the switching element to the motor are disposed on a mating face side of the motor-housing section with the compressor-housing section.

6. The integrated electric compressor according to claim 1, wherein on the first board, a voltage application wiring pattern for supplying a voltage to the switching element and an output wiring pattern for applying a voltage from the switching element to the motor are disposed so as to oppose to a signal line pattern for supplying a control signal for driving the switching element, with the IGBT and the diode that constitute the switching element interposed.

7. The integrated electric compressor according to claim 1, wherein a temperature sensor for detecting operating temperatures of the IGBT is disposed in a region where the IGBT and the diode are arrayed.

\* \* \* \* \*